(12) United States Patent
Nandwana et al.

(10) Patent No.: US 9,614,537 B1
(45) Date of Patent: Apr. 4, 2017

(54) DIGITAL FRACTIONAL-N MULTIPLYING INJECTION LOCKED OSCILLATOR

(71) Applicant: Xilinx, Inc., San Jose, CA (US)

(72) Inventors: Romesh Kumar Nandwana, Urbana, IL (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/093,655

(22) Filed: Apr. 7, 2016

(51) Int. Cl.
    *H03L 7/06*     (2006.01)
    *H03L 7/197*     (2006.01)
    *H03L 7/24*     (2006.01)
    *H03L 7/099*     (2006.01)

(52) U.S. Cl.
    CPC .......... *H03L 7/1976* (2013.01); *H03L 7/0994* (2013.01); *H03L 7/24* (2013.01)

(58) Field of Classification Search
None
See application file for complete search history.

(56) References Cited

U.S. PATENT DOCUMENTS

| | | | |
|---|---|---|---|
| 7,236,026 B1 * | 6/2007 | Samad | .................. H03L 7/087 327/147 |
| 7,436,227 B2 * | 10/2008 | Thomsen | ................ H03L 1/022 327/147 |
| 8,736,325 B1 | 5/2014 | Savoj et al. | |
| 8,841,948 B1 * | 9/2014 | Chien | ..................... H03L 7/081 327/149 |
| 9,306,585 B1 | 4/2016 | Elkholy et al. | |
| 9,306,730 B1 | 4/2016 | Shu et al. | |
| 2010/0013533 A1 * | 1/2010 | Lee | ....................... H03H 11/265 327/159 |

OTHER PUBLICATIONS

Marucci, Giovanni et al., A 1.7GHz MDLL-Based Fractional-N Frequency Synthesizer with 1.4ps RMS Integrated Jitter and 3mW Power Using a 1b TDC, 2014 IEEE International Solid-State Circuits Conference, ISSCC 2014, Session 21, Frequency Generation Techniques, 21.1, 3 pages, Feb. 14, 2014.

(Continued)

*Primary Examiner* — Cassandra Cox
(74) *Attorney, Agent, or Firm* — Robert M. Brush; Keith Taboada (57) ABSTRACT

An example clock generator circuit includes a fractional reference generator configured to generate a reference clock in response to a base reference clock and a phase error signal, the reference clock having a frequency that is a rational multiple of a frequency of the base reference clock. The clock generator circuit includes a digitally controlled delay line (DCDL) that delays the reference clock based on a first control code, and a pulse generator configured to generate pulses based on the delayed reference clock. The clock generator circuit includes a digitally controlled oscillator (DCO) configured to generate an output clock based on a second control code, the DCO including an injection input coupled to the pulse generator to receive the pulses. The clock generator circuit includes a phase detector configured to compare the output clock and the reference clock and generate the phase error signal, and a control circuit configured to generate the first and second control codes based on the phase error signal.

20 Claims, 4 Drawing Sheets

(56) References Cited

OTHER PUBLICATIONS

Elkholy, Ahmed et al., A 6.75 to 8.25GHz 2.25mW 190fs rms Integrated—Jitter PVT—Insensitive Injection-Locked Clock Multiplier Using All-Digital Continuous Frequency-Tracking Loop in 65nm CMOS, 2015 IEEE International Solid-State Circuits Conference, ISSCC 2015, Session 10, Advanced Wireline Techniques and PLLs, 10.7, 3 pages, Feb. 24, 2015.

* cited by examiner

DIGITAL FRACTIONAL-N MULTIPLYING INJECTION LOCKED OSCILLATOR

TECHNICAL FIELD

Examples of the present disclosure generally relate to electronic circuits and, in particular, to a digital fractional-N multiplying injection locked oscillator.

BACKGROUND

A fractional-N clock generator is an integral component of wireline and wireless systems. For acceptable noise performance, a fractional clock can be generated using inductance-capacitance (LC)-based fractional-N phase locked loops (PLLs). LC-based fractional PLLs, however, consume a large implementation area within an integrated circuit (IC). As such, LC-based fractional PLLs are not well-suited for deep sub-micron ICs. On the other hand, ring voltage controlled oscillator (VCO)-based fractional PLLs consume less implementation area than LC-based fractional PLLs, but have worse noise performance. It is therefore desirable to provide a fractional-N oscillator circuit that both conserves implementation area and exhibits acceptable noise performance.

SUMMARY

Techniques for providing a digital fractional-N multiplying injection locked oscillator are described. In an example, a clock generator circuit includes a fractional reference generator configured to generate a reference clock in response to a base reference clock and a phase error signal, the reference clock having a frequency that is a rational multiple of a frequency of the base reference clock. The clock generator circuit further includes a digitally controlled delay line (DCDL) configured to delay the reference clock based on a first control code. The clock generator circuit further includes a pulse generator configured to generate pulses based on the delayed reference clock. The clock generator circuit further includes a digitally controlled oscillator (DCO) including an injection input coupled to the pulse generator to receive the pulses, the DCO configured to generate an output clock based on the pulses and a second control code. The clock generator circuit further includes a phase detector configured to compare phases of the output clock and the reference clock and generate the phase error signal. The clock generator circuit further includes a control circuit configured to generate the first and second control codes based on the phase error signal.

In another example, a clock generator circuit includes a fractional reference generator having a first input configured to receive a base reference clock, a second input configured to receive a frequency control code, a third input, and an output configured to provide a reference clock. The clock generator circuit further includes a digitally controlled delay line (DCDL) having a first input coupled to the output of the fractional reference generator, a second input, and an output. The clock generator circuit further includes a pulse generator having a first input coupled to the output of the DCDL, a second input, and an output. The clock generator circuit further includes a digitally controlled oscillator (DCO) having a first input coupled to the output of the pulse generator, a second input, and an output configured to provide an output clock. The clock generator circuit further includes a phase detector having a first input coupled to the output of the DCO, a second input coupled to the output of the fractional reference generator, and an output coupled to the third input of the reference frequency generator. The clock generator circuit further includes a control circuit having a first input coupled to the output of the phase detector, a first output coupled to the second input of the DCDL, a second output coupled to the second input of the pulse generator, and a third output coupled to the second input of the DCO.

In another example, a method of generating an output clock includes generating a reference clock in response to a base reference clock and a phase error, the reference clock having a frequency that is a rational multiple of a frequency of the base reference clock. The method further includes delaying the reference clock based on a first control code. The method further includes generating pulses based on the delayed reference clock. The method further includes generating the output clock based on a second control code and the pulses. The method further includes comparing the phases of output clock and the reference clock and generate the phase error signal. The method further includes generating the first and second control codes based on the phase error signal.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

A digital fractional-N multiplying injection locked oscillator is described. In an example, the oscillator circuit includes a fractional-N multiplying injection-locked loop that provides integral path control for frequency tracking and a pulse generator path for oscillator noise suppression. The oscillator circuit employs injection gating to alternate between tracking and noise suppression. In an example, a calibrated digitally controlled delay loop (DCDL) is used to generate a fractional-N reference clock. A second DCDL is used to create a delay locked loop (DLL), which changes the pulse generator injection timing. This DLL loop provides a second order noise shaping transfer function for the oscillator to suppress both random and flicker noise. In addition, the DLL provides for phase detector offset cancellation to reduce the deterministic jitter.

Figure 1:
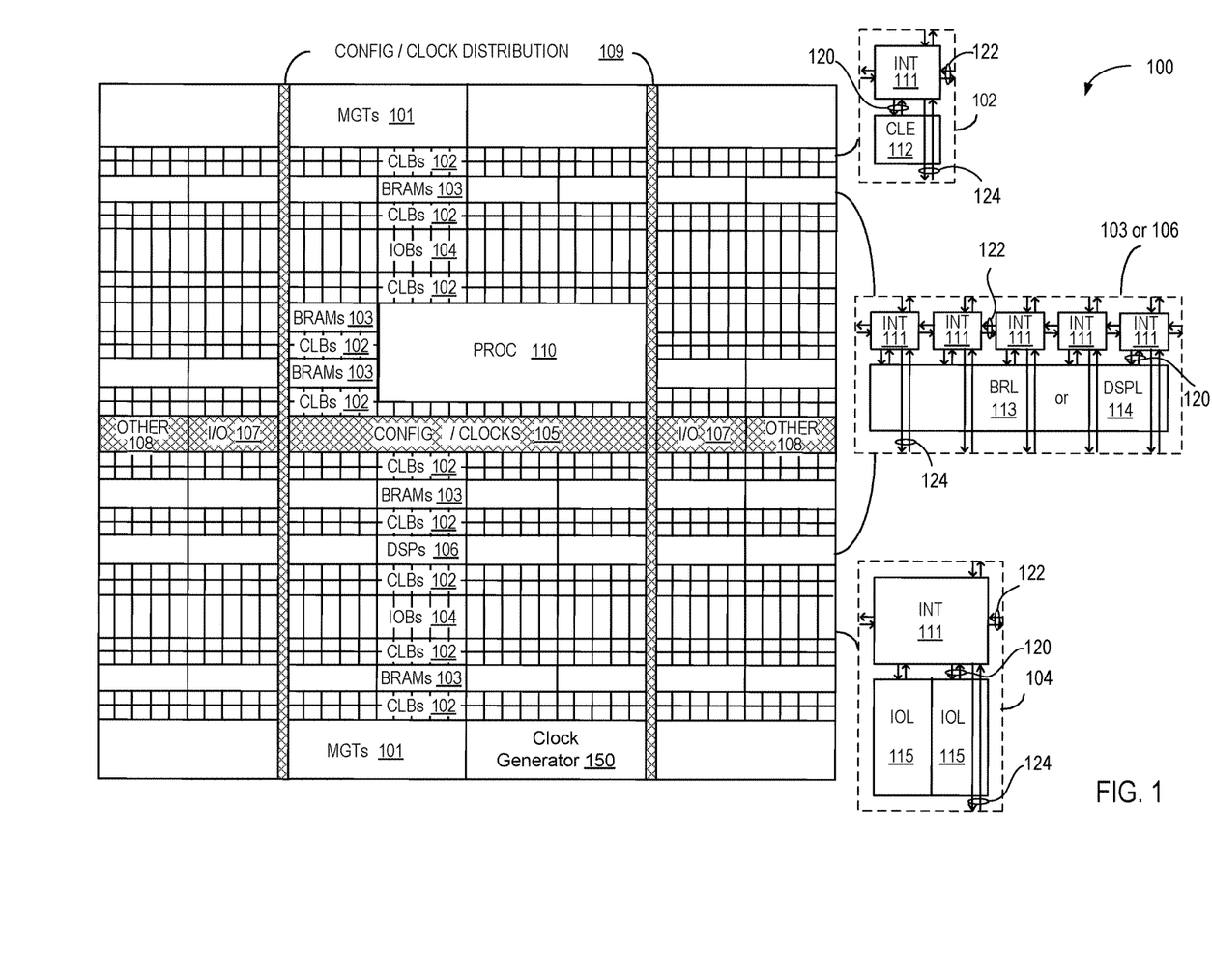
FIG. 1 illustrates an example architecture of a field programmable gate array (FPGA) in which a clock generator according to examples can be employed.

FIG. 1 illustrates an example architecture of an FPGA 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108, such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1A. Each programmable interconnect element 111 (also referred to as "interconnect element 111") can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured example, a horizontal area near the center of the die (shown in FIG. 1A) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs. The processor block 110 can include various components ranging from a single microprocessor to a complete programmable processing system of microprocessor(s), memory controllers, peripherals, and the like.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. In another example, an FPGA can include an entire processing system (e.g., processor, memory, peripherals, etc.) instead of, or in addition to, the processor block 110. In such an implementation, a System-on-Chip (Soc) can include a programmable fabric (programmable logic as shown in FPGA 100) in communication with a processing system.

The FPGA 100 can include a clock generator 150. The clock generator 150 can be a digital fractional-N multiplying injection locked oscillator as described in examples herein. The clock generator 150 can be used to generate a clock of a desired frequency for various circuits in the FPGA 100, such as with MGTs 101 or circuits configured in the programmable fabric. As described below, the clock generator 150 can be all digital or substantially digital and is particular suited for a sub-micron fabrication process used to fabricate the FPGA 100. Further, the clock generator 150 implements fractional-N multiplication of a base reference clock, providing for increased flexibility and performance as compared to integer-N clock generators. Further, the clock generator 150 includes an architecture that suppresses the oscillator flicker noise and generates an output clock having low jitter. The FPGA 100 can include more than one instance of the clock generator 150. While the FPGA 100 is shown as an example system that can use the clock generator 150, the clock generator 150 can be used in a myriad of other systems to generate a low noise, low jitter output clock.

Figure 2:
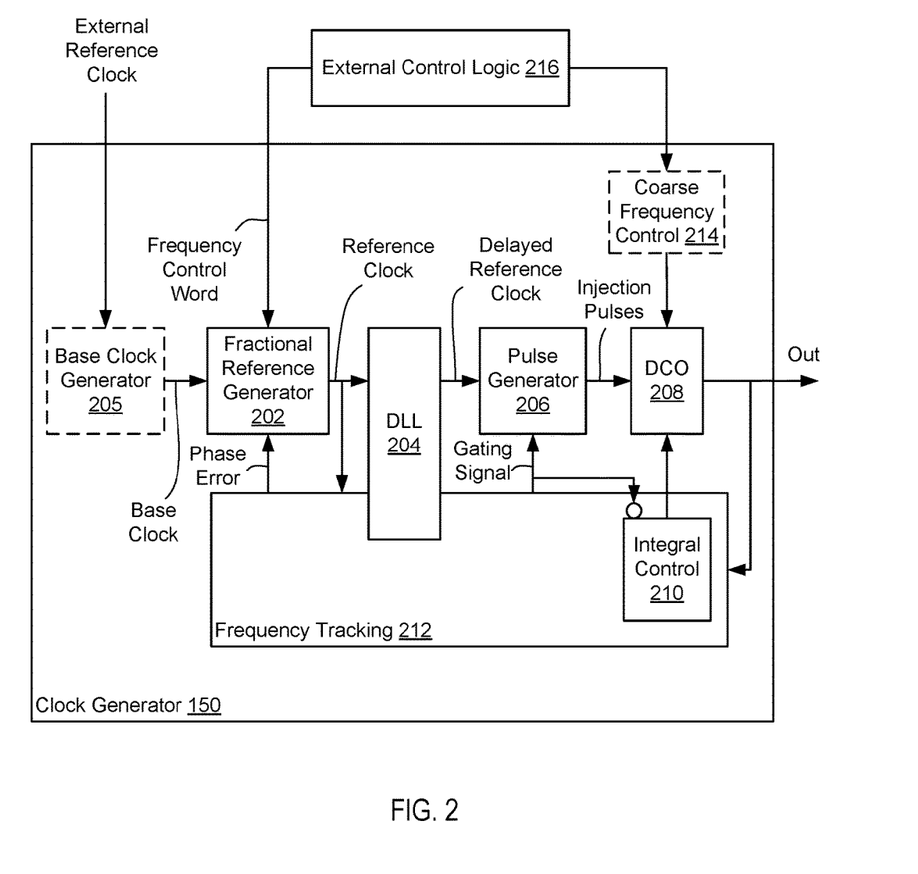
FIG. 2 is a block diagram depicting an example of a clock generator.

FIG. 2 is a block diagram depicting an example of the clock generator 150. The clock generator 150 includes a fractional reference generator 202, a delay locked loop (DLL) 204, a pulse generator 206, a digitally controlled oscillator (DCO), an integral control circuit 210, and a frequency tracking circuit 212. In some examples, the clock generator 150 can include a base clock generator 205. In some examples, the clock generator 150 can include a coarse frequency control circuit 214. In other examples, the base clock generator 205 and/or the coarse frequency control circuit 214 can be omitted. In one example, the clock generator 150 can receive an external reference clock from an external clock source (e.g., a crystal oscillator or the like). Alternatively, the clock generator 150 can receive the external reference clock from an internal source (e.g., another phase-locked loop (PLL) in the IC). The clock generator 150 can be coupled to external control logic 216. The external control logic 216 can be configured to program the clock generator 150 to generate an output clock having a desired frequency. For example, the external control logic 216 can be part of the FPGA 100 described above.

An input of the base clock generator 205 receives the external reference clock. An output of the base clock generator 205 is coupled to an input of the fractional reference generator 202. The base clock generator 205 provides a base clock (also referred to as a base reference clock) for use by the fractional reference generator 202.

Figure 3:
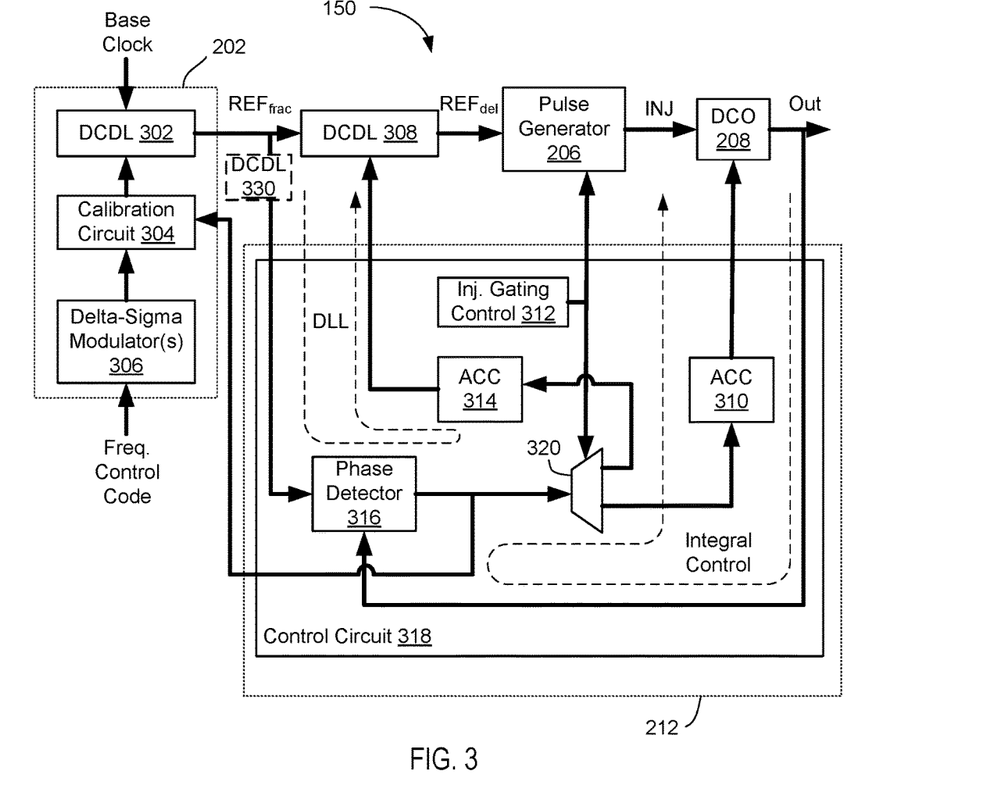
FIG. 3 is a block diagram depicting a specific example of the clock generator.

Additional inputs of the fractional reference generator 202 receive a frequency control signal and a phase error signal. The frequency control signal can be generated by the external control logic 216. The phase error signal is generated by the frequency tracking circuit 212. The fractional reference generator 202 includes an output coupled to an input of the DLL 204 and an input of the frequency tracking circuit 212. The output of the fractional reference generator 202 provides a reference clock. An example of the fractional reference generator 202 is shown in FIG. 3 and described below.

The DLL 204 includes an output coupled to an input of the pulse generator 206. The output of the DLL 204 provides a delayed reference clock for used by the pulse generator 206. An example of the DLL 204 is shown in FIG. 3 and described below. The clock generator 150 includes an "injection path" comprising the fractional reference generator 202, the DLL 204, and the pulse generator 206. A portion of the DLL 204 resides on the injection path. Another portion of the DLL 204 shares circuits with the frequency tracking circuit 212.

An output of the pulse generator 206 is coupled to an input of the DCO 208. The output of the pulse generator 206 provides a sequence of pulses, referred to herein as "injection pulses." Another input of the pulse generator 206 can receive a gating signal from the frequency tracking circuit 212. The gating signal causes the pulse generator 206 to selectively gate the pulses. That is, when the gating signal is active, the pulse generator 206 does not generate pulses from the delayed reference clock. When the gating signal is inactive, the pulse generator 206 generates the pulses from the delayed reference clock. The integral control circuit 210 is configured to receive a logical inversion of the gating signal. As such, when the pulse generator 206 is active the integral control circuit 210 is inactive and vice versa. In some examples, the pulses can have a static width. In other examples, the pulse generator 206 can be programmable and the pulse width can be dynamically changed (e.g., by the external control logic 216). The pulse generator 206 can be implemented using digital logic. Various digital or analog pulse generation circuits can be employed to implement the pulse generator 206 based on the implementation of the DCO 208. In general, the pulse generator 206 includes combinatorial logic, such one or more logic gates, and can also include sequential logic, such as one or more flip-flops.

An additional input of the DCO 208 is coupled to an output of the coarse frequency control circuit 214. Yet another input of the DCO 208 is coupled to an output of the integral control circuit 210. An output of the DCO 208 provides an output clock. The DCO 208 can be implemented using digital circuits or a combination of digital and analog circuits. In an example, the DCO 208 includes a ring voltage controlled oscillator (VCO). Other types of VCOs can also be employed. Alternatively, other types of oscillators can be employed, such as a numerically controlled oscillator (NCO). In general, the DCO 208 includes a frequency control port and an injection port. The frequency control port is used to adjust the frequency of the DCO 208. The frequency control port can be divided into a coarse frequency select (CFS) port and a fine frequency select (FFS). In the example shown, the coarse frequency control circuit 214 is coupled to the CFS port and the integral control circuit 210 is coupled to the FFS port. The pulse generator 206 is coupled to the injection port. The injection port is used to injection-lock the oscillator to a particular harmonic of the injection pulse frequency, which can be an integer or fractional multiple of the base clock. The desired harmonic can be selected by tuning the DCO 208 near the desired harmonic using the frequency control port.

The integral control circuit 210 is part of the frequency tracking circuit 212. An input of the frequency tracking circuit 212 is coupled to the output of the DCO 208. Outputs of the frequency tracking circuit 212 include the output of the integral control circuit 210, the output providing the gating signal to the pulse generator 206, and the output providing the phase error signal to the fractional reference generator 202. Examples of the frequency tracking circuit 212 and the integral control circuit 210 are shown in FIG. 3 and described below.

In operation, the external control logic 216 programs the clock generator 150 to generate the output clock having a frequency that is "N.F" times the frequency of the base clock. The fractional reference generator 202 generates the reference clock having a frequency that is a rational multiple of the frequency of the base clock. In some examples, the rational multiple is set as a non-integer multiple of the base clock frequency. The rational multiplier applied by the fractional reference generator 202 can be set to obtain the desired fractional portion of the N.F multiplier applied by the clock generator 150.

The DLL 204 between the fractional reference generator 202 and the pulse generator 206 adjusts the timing of the injection pulses. The DLL 204 along with the pulse injection provides a second-order noise shaping transfer function for the DCO 208 to suppress both random and flicker noise. The DLL 204 also facilitates offset cancellation to reduce deterministic jitter. The pulse generator 206 generates the pulses according to the delayed reference clock. When the gating signal is inactive, the pulses are coupled to the injection port of the DCO 208. When the gating signal is active, one or more pulses are skipped and not applied to the injection port of the DCO 208 and the integral control circuit 210 is active. The integral control circuit 210 and/or the coarse frequency control circuit 214 tune the frequency of the DCO 208 near an Nth harmonic of the reference clock frequency. In this manner, the clock generator 150 applies an N.F multiplier to the frequency of the base clock.

The frequency tracking circuit 212 generates a phase error as a calibration signal for the fractional reference generator 202. The frequency tracking circuit 212 also selectively couples the phase error to the DLL 204 or the integral control circuit 210 as negative feedback based on the state of the gating signal. When the pulses are not gated, the frequency tracking circuit 212 couples the phase error to the DLL 204 as negative feedback. When the pulses are gated, the frequency tracking circuit 212 couples the phase error to the integral control circuit 210 as negative feedback. The DLL 204 adjusts the injection pulse timing to minimize the phase offset and provide DCO phase noise suppression. The integral control circuit 210 adjusts the frequency of the DCO 208 to minimize the phase error. The frequency tracking circuit 212 (or direct external control) can set the frequency and duty cycle of the gating signal.

FIG. 3 is a block diagram depicting a specific example of the clock generator 150. As shown in FIG. 3, the fractional reference generator 202 includes a digitally control delay line (DCDL) 302, a calibration circuit 304, and at least one delta-sigma modulator 306. Input(s) of the delta-sigma modulator(s) 306 receive a frequency control code. Output(s) of the delta-sigma modulator(s) 306 is/are coupled to an input of the calibration circuit 304. Another input of the calibration circuit 304 is coupled to receive the phase error signal. An output of the calibration circuit 304 is coupled to an input of the DCDL 302. An input of the DCDL 302 receives the base reference clock. An output of the DCDL 302 provides the reference clock, referred to as $REF_{frac}$.

In operation, the DCDL 302 applies a variable delay to the base reference clock to generate the reference clock. The amount of the delay is controlled by the calibration circuit 304. The calibration circuit 304 adjusts the delay applied by the DCDL 302 based on output(s) of the delta-sigma modulator(s) 306 and the phase error such that the maximum delay range is integer multiples of DCO clock period depending upon the order of the delta sigma modulator(s) 306. In one example, the delta-sigma modulator(s) 306 include a single delta-sigma modulator. The delta-sigma modulator causes the calibration circuit 304 to modulate the delay between multiple values based on the frequency control code. The frequency of the reference clock thus obtains an average value over time of some rational multiple of the base clock frequency. In another example, the delta-sigma modulator(s) 306 include a pair of delta-sigma modulators. A first delta-sigma modulator converts multi-bit frequency information into a lesser number of bits while keeping the resolution information intact. The second delta-sigma modulator converts the frequency information into phase information by accumulating the frequency signal.

The frequency tracking circuit 212 includes a control circuit 318. The control circuit 318 includes a phase detector 316, an injection gating control circuit 312, a digital accumulator 314 (ACC), a digital accumulator 310 (ACC), and a de-multiplexer 320. The DLL 204 includes a DCDL 308, the phase detector 316, and the digital accumulator 314 (shown by the dashed DLL path). The DCDL 308 is coupled between the DCDL 302 and the pulse generator 206. An input of the DCDL 308 is coupled to the output of the DCDL 302. Another input of the DCDL 308 is coupled to an output of the digital accumulator 314. An output of the DCDL 308 is coupled to the input of the pulse generator 206. The DCDL 308 provides the delayed reference clock as output, referred to as $REF_{del}$. In an example, the clock generator 150 also includes a DCDL 330 coupled between the output of the fractional reference generator 202 and the input of the phase detector 316. The DCDL 330 is configured to cancel nominal offset delay.

The integral control circuit 210 includes the digital accumulator 310 and the phase detector 316 (shown by the dashed integral control path). An output of the digital accumulator 310 is coupled to a frequency control input of the DCO 208. Inputs of the phase detector 316 are coupled to outputs of the DCDL 302 and the DCO 208, respectively. An output of the phase detector 316 is coupled to an input of the de-multiplexer 320 and an input of the calibration circuit. Outputs of the de-multiplexer 320 are coupled to inputs of the digital accumulators 314 and 310, respectively.

A control input of the de-multiplexer 320 is coupled to an output of the injection gating control circuit 312.

In operation, the injection gating control circuit 312 generates the gating control signal. When the gating control signal is inactive, the pulses generated by the pulse generator 206 are coupled to the injection port of the DCO 208. Also, the de-multiplexer 320 couples the phase error signal generated by the phase detector 316 to the digital accumulator 314. In an example, the phase detector 316 comprises a sub-sampling bang-bang phase detector. Other types of phase detectors can also be used. In general, the phase detector 316 compares the phases of the output clock and the reference clock to determine a phase error. The phase error signal can have discrete single-bit or multi-bit values, such as +1, 0, and −1 (e.g., up/down values). When the gating signal is inactive, the phase error updates the digital accumulator 314, which in turn adjusts the delay applied by the DCDL 308 to produce the delayed reference clock. The loop formed by the DCDL 308, the digital accumulator 314, and the phase detector 316 functions as the DLL 204 described above.

When the gating control signal is active, the pulses generated by the pulse generator 206 are gated and not coupled to the injection port of the DCO 208. Also, the de-multiplexer 320 couples the phase error signal generated by the phase detector 316 to the digital accumulator 310. The phase error updates the digital accumulator 310, which in turn adjusts the frequency of the DCO 208. The loop formed by the DCO 208, the digital accumulator 310, and the phase detector 316 provides for integral frequency control.

Figure 4:
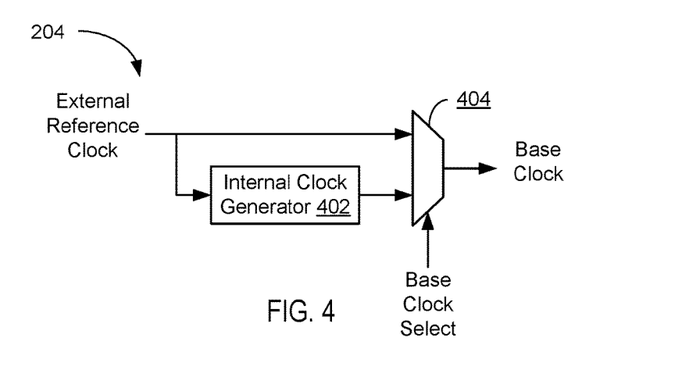
FIG. 4 is a block diagram depicting an example of a base clock generator.

FIG. 4 is a block diagram depicting an example of the base clock generator 205. The base clock generator 205 includes a multiplexer 404 and an internal clock generator 402. Inputs of the multiplexer 404 are coupled to receive the external reference clock and an internal reference clock generated by the internal clock generator 402. The internal clock generator 402 can include an input coupled to receive the external reference clock and an output coupled to an input of the multiplexer 404. The internal clock generator 402 generates a reference clock based on the external reference clock. A control input of the multiplexer 404 receives a base clock select signal. An output of the multiplexer 404 provides the base clock. If the external clock is clean, then the external clock can be used as the base clock. Otherwise, the internal clock can be used. The base clock can be selected by an external control circuit, such as the external control logic 216. In an example, the internal clock generator 402 can include a PLL or multiplying DLL (MDLL) coupled to a divider.

Figure 5:
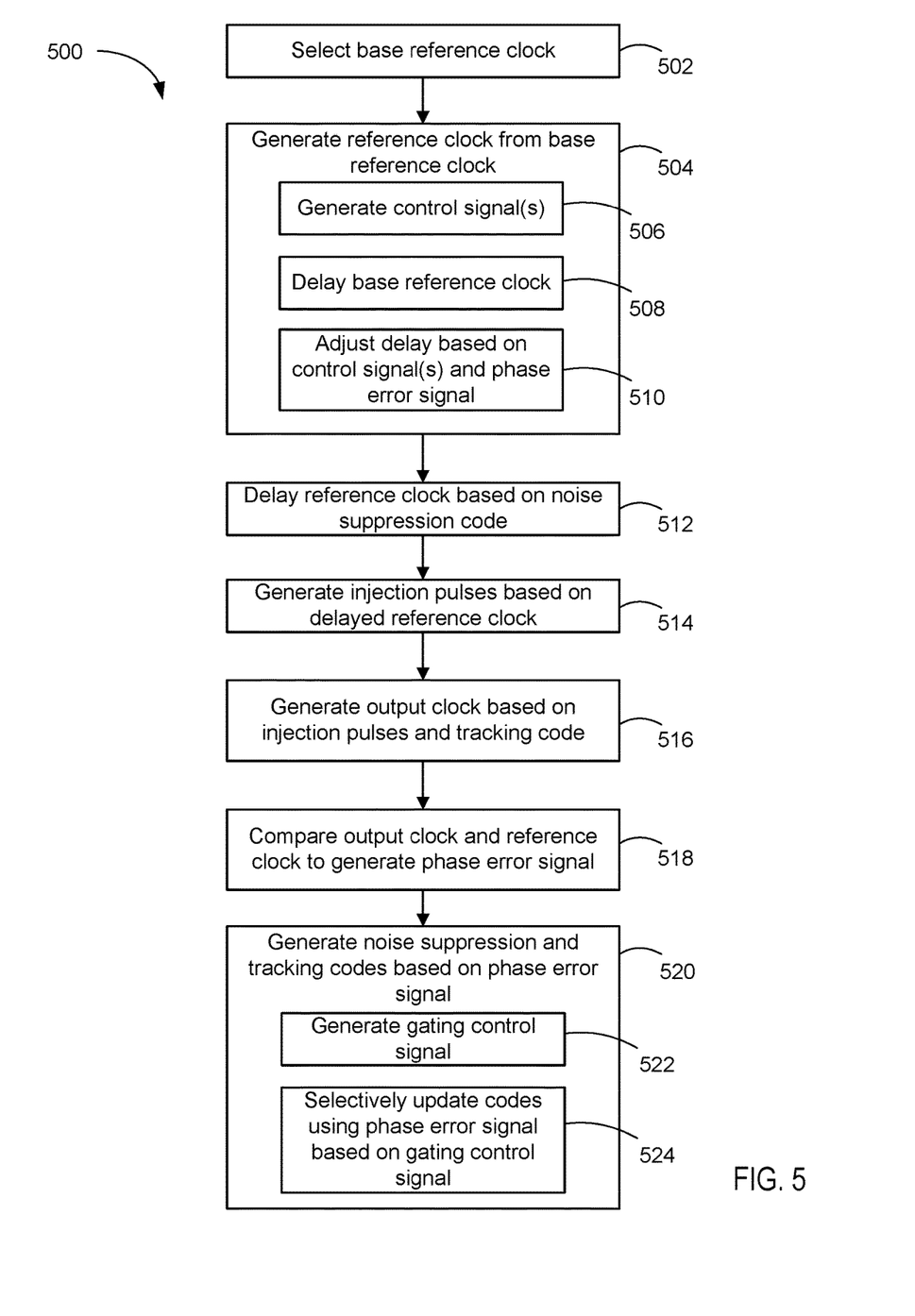
FIG. 5 is a flow diagram depicting a method of generating an output clock according to an example.

FIG. 5 is a flow diagram depicting a method 500 of generating an output clock according to an example. The method 500 can be performed by the clock generator 150 described herein. The steps of the method 500 are shown in sequence for illustration purposes only. The actual steps/functions of the method 500 are performed concurrently by the hardware of the clock generator 150.

At step 502, an external control circuit selects a base reference clock. At step 504, the fractional reference generator 202 generates a reference clock from the base reference clock. In particular, at step 506, the delta-sigma modulator(s) 306 generate control signal(s). At step 508, the DCDL 308 delays the base reference clock. At step 510, the calibration circuit 304 adjusts the delay based on the control signal(s) and a phase error signal.

At step 512, the DCDL 308 delays the reference clock based on a noise suppression code provided by the digital accumulator 314. At step 514, the pulse generator 206 generates injection pulses based on the delayed reference clock. At step 516, the DCO 208 generates an output clock based on the injection pulses and a tracking code from the digital accumulator 310.

At step 518, the phase detector 316 compares the output clock and the reference clock to generate the phase error signal. At step 520, the phase error signal is used to generate the tracking and noise suppression codes. In particular, at step 522, the injection gating control circuit 312 generates a gating control signal. At step 524 the de-multiplexer 320 selectively couples the phase error signal to update the codes based on the gating control signal.

While the foregoing is directed to specific examples, other and further examples may be devised without departing from the basic scope thereof, and the scope thereof is determined by the claims that follow.

What is claimed is:

1. A clock generator circuit, comprising:
   a fractional reference generator configured to generate a reference clock in response to a base reference clock and a phase error signal, the reference clock having a frequency that is a rational multiple of a frequency of the base reference clock;
   a digitally controlled delay line (DCDL) configured to delay the reference clock based on a first control code;
   a pulse generator configured to generate pulses based on the delayed reference clock;
   a digitally controlled oscillator (DCO) including an injection input coupled to the pulse generator to receive the pulses, the DCO configured to generate an output clock based on the pulses and a second control code;
   a phase detector configured to compare phases of the output clock and the reference clock and generate the phase error signal; and
   a control circuit configured to generate the first and second control codes based on the phase error signal.

2. The clock generator circuit of claim 1, wherein the control circuit is further configured to control the pulse generator to periodically gate the pulses at a gating rate.

3. The clock generator circuit of claim 1, wherein the DCDL is a first DCDL and wherein the fractional reference generator comprises:
   at least one delta-sigma modulator configured to generate at least one control signal based on a third control code;
   a second DCDL configured to delay the base reference clock to generate the reference clock; and
   a calibration circuit configured to adjust the delay of the second DCDL based on the at least one control signal and the phase error signal.

4. The clock generator of claim 1, wherein the rational multiple is a non-integer multiple.

5. The clock generator of claim 1, wherein the control circuit comprises:
   a first digital accumulator configured to generate the first control code based on the phase error signal; and
   a second digital accumulator configured to generate the second control code based on the phase error signal.

6. The clock generator of claim 5, wherein the control circuit further comprises:
   a gate control circuit configured to generate a gate control signal, the gate control signal being coupled to the pulse generator; and
   a de-multiplexer configured to selectively couple the phase error signal to either the first digital accumulator or the second digital accumulator based on the gate control signal.

7. The clock generator of claim 1, further comprising:
   a multiplexer configured to select either an external reference clock or an internal reference clock as the base reference clock based on a select signal.

8. A clock generator circuit, comprising:
   a fractional reference generator having a first input configured to receive a base reference clock, a second input configured to receive a frequency control code, a third input, and an output configured to provide a reference clock;
   a digitally controlled delay line (DCDL) having a first input coupled to the output of the fractional reference generator, a second input, and an output;
   a pulse generator having a first input coupled to the output of the DCDL, a second input, and an output;
   a digitally controlled oscillator (DCO) having a first input coupled to the output of the pulse generator, a second input, and an output configured to provide an output clock;
   a phase detector having a first input coupled to the output of the DCO, a second input coupled to the output of the fractional reference generator, and an output coupled to the third input of the reference frequency generator; and
   a control circuit having a first input coupled to the output of the phase detector, a first output coupled to the second input of the DCDL, a second output coupled to the second input of the pulse generator, and a third output coupled to the second input of the DCO.

9. The clock generator circuit of claim 8, wherein the DCDL is a first DCDL, and wherein fractional reference generator comprises:
   at least one delta-sigma modulator each having an input and output, the input of each delta-sigma modulator being the second input of the fractional reference generator;
   a calibration circuit having a first input coupled to the output of each delta-sigma modulator, a second input, and an output, the second input of the calibration circuit being the third input of the fractional reference generator; and
   a second DCDL having a first input, a second input coupled to the output of the calibration circuit, and an output, the first input of the second DCDL being the first input of the fractional reference generator and the output of the second DCDL being the output of the fractional reference generator.

10. The clock generator circuit of claim 8, wherein the control circuit comprises:
    a first digital accumulator having an input and an output, the output of the first digital accumulator being the first output of the control circuit; and
    a second digital accumulator having an input and an output, the output of the second digital accumulator being the third output of the control circuit.

11. The clock generator of claim 10, wherein the control circuit further comprises:
    a gate control circuit having an output being the second output of the control circuit.

12. The clock generator circuit of claim 11, wherein the control circuit further comprises:
    a de-multiplexer having a first input coupled to the output of the phase detector, a second input coupled to the output of the gate control circuit, a first output coupled to the input of the first digital accumulator, and a second output coupled to the input of the second digital accumulator.

13. The clock generator circuit of claim 8, further comprising:
   a multiplexer having a first input configured to receive an external reference clock, a second input configured to receive an internal reference clock, a third input configured to receive a select signal, and an output coupled to the first input of the fractional reference generator to provide the base reference clock.

14. The clock generator of claim 8, wherein the phase detector comprises a sub-sampling bang-bang phase detector.

15. A method of generating an output clock, comprising:
   generating a reference clock in response to a base reference clock and a phase error, the reference clock having a frequency that is a rational multiple of a frequency of the base reference clock;
   delaying the reference clock based on a first control code;
   generating pulses based on the delayed reference clock;
   generating the output clock based on a second control code and the pulses;
   comparing phases of the output clock and the reference clock and generate the phase error signal; and
   generating the first and second control codes based on the phase error signal.

16. The method of claim 15, further comprising:
   periodically gating the pulses at a gating rate.

17. The method of 15, wherein the step of generating the reference clock comprises:
   generating at least one control signal using at least one delta-sigma modulator based on a third control code;
   delaying the base reference clock to generate the reference clock; and
   adjusting the delay of the second DCDL based on the at least one control signal and the phase error signal.

18. The method of claim 15, wherein the step of generating the first and second control codes comprises:
   generating the first control code based on the phase error signal; and
   generating the second control code based on the phase error signal.

19. The method of claim 18, wherein step of generating the first and second control codes further comprises:
   generating a gate control signal to gate the pulses at a gating rate; and
   selectively updating the first control code or the second control code based on the gate control signal.

20. The method of claim 15, further comprising:
   selecting either an external reference clock or an internal reference clock as the base reference clock based on a select signal.

* * * * *